(12) United States Patent
Charbon et al.

(10) Patent No.: US 8,781,028 B2
(45) Date of Patent: Jul. 15, 2014

(54) INTEGRATED RECEIVING CIRCUIT AND METHOD FOR RADIOFREQUENCY AND HIGH SPEED SIGNALS

(75) Inventors: Edoardo Charbon, Echandens (CH); Marek Gersbach, Lausanne (CH); Maximilian Sergio, Lausanne (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 998 days.

(21) Appl. No.: 12/724,586

(22) Filed: Mar. 16, 2010

(65) Prior Publication Data

US 2010/0208845 A1 Aug. 19, 2010

Related U.S. Application Data

(63) Continuation of application No. PCT/EP2007/059995, filed on Sep. 20, 2007.

(51) Int. Cl.
*H04L 27/00* (2006.01)

(52) U.S. Cl.
USPC ........... 375/316; 330/277; 330/296; 330/307; 330/308; 257/186; 257/438; 250/389

(58) Field of Classification Search
USPC ............... 375/316; 250/214, 363.03, 207, 250/363.03 R
See application file for complete search history.

(56) References Cited

U.S. PATENT DOCUMENTS 7,705,284 B2 * 4/2010 Inoue et al. ................ 250/214 R
7,990,167 B2 * 8/2011 Kasapi ..................... 324/754.23
2006/0249747 A1 * 11/2006 Shushakov et al. ........... 257/122

OTHER PUBLICATIONS

Niclass et al: "A 4mus integration time imager based on CMOS single photon avalanche diode technology" Sensors and Actuators, vol. 130-131, Aug. 14, 2006, pp. 273-281.*

Niclass, et al., "A 4 us integration time imager based on CMOS single photon avalanche diode technology," Sensors and Actuators A, Elsevier Sequoia S.A., Lausanne, CH, vol. 130-131, Aug. 14, 2006, pp. 273-281.

* cited by examiner

*Primary Examiner* — Daniel Washburn
*Assistant Examiner* — Eboni Hughes
(74) *Attorney, Agent, or Firm* — Blank Rome LLP

(57) ABSTRACT

Integrated receiving circuit for radiofrequency signals an amplifying element using the multiplication zone of a reverse biased semiconductor junction operating in Geiger mode for amplifying an input radiofrequency signal (Vin) and converting it into a digital signal. And a digital part for digitally processing the digital signal.

13 Claims, 4 Drawing Sheets

INTEGRATED RECEIVING CIRCUIT AND METHOD FOR RADIOFREQUENCY AND HIGH SPEED SIGNALS

This application is a continuation of a PCT application No. PCT/EP2007/059995 (WO2009/036802), filed Sep. 20, 2007, the contents of which is hereby incorporated in its entirety by reference.

BACKGROUND INFORMATION

1. Field of the Invention

The present invention concerns an integrated receiving circuit for receiving and processing high speed and radiofrequency signals.

2. Description of Related Art

Many receiving circuits are known for receiving and demodulating radiofrequency signals. Most arrangements comprise at least two integrated circuits, i.e. a radiofrequency circuit and at least one digital processing circuit.

The radiofrequency integrated circuit (RF IC) of known arrangements typically includes analogue components, whose function is to amplify a signal received from an antenna and to process this signal in order to provide at its output a demodulated signal of lower frequency, like a baseband signal, analogue or digital, or an IF signal. The demodulation is usually performed with analogue components. Other components, including analogue filters, mixers and so on may be included in the radiofrequency circuit.

The digital processing circuit receives the digital or analogue signal(s) output by the RF IC and digital process those signals in order to extract the requested information.

This very common setting is used for example, but not only, in wireless communication systems, radiofrequency receivers, GPS receivers, local positioning systems based on time of flights, radars, and other various kinds of receivers. However, the need for two different integrated circuits increase the price, volume, power consumption and failure rate of the overall system. Moreover, common RF integrated circuits tend to be costly, complex to develop, and often deliver an output signal with a poor signal-to-noise ratio. The known methods thus may perform poorly in systems, such as radiofrequency (RF) ultra-wideband (UWB) receivers, where only short pulses may be used to carry information.

The analogue-to-digital conversion required by known systems further increases the price and power consumption of the system.

It is therefore an aim of the present invention to provide an improved radiofrequency receiving circuit and method that solves at least some of the problems of the prior art.

BRIEF SUMMARY OF THE INVENTION

According to the invention, these aims are achieved by means of an integrated receiving circuit for radiofrequency signals comprising an amplifying element using the multiplication zone of a reverse biased semiconductor junction operating in Geiger mode for amplifying an input radiofrequency signal and converting it into a digital signal; and a digital part for digitally processing said digital signal.

The use of a single integrated circuit reduces the cost, volume and power consumption of the system. Using a semiconductor component operating in Geiger mode allows an extremely high multiplication gain, making the solution suitable for applications where the strength of the input signal is so low that only a few charges are associated to each bit of information. Moreover, the output of this amplifying element is a digital signal and it may be directly processed digitally, thus allowing an entirely digital mixing and demodulation system. Consequently, reception, amplification, A/D conversion, demodulation and digital demodulation processing of the antenna signal are all performed by a single low-cost chip.

The circuit and method of the invention thus enable ultra-low noise amplification of an incoming signal generated, in one embodiment in an antenna, and its detection and further processing. The circuit and method allow one to detect short pulses (perhaps a few nanoseconds wide or less) of electrical energy with very high timing precision (perhaps a few tens of picoseconds or less). This property is useful in pulse position modulation (PPM) based communication systems as well as in local positioning systems based on time-of-arrival (TOA) or time-of-flight (TOF).

Due to the timing accuracy with which a charge absorbed in the multiplication region can be detected, the device can be envisioned for applications in which a pulse of energy must be detected with very high timing precision either because it encodes information or because the geographic position of the transmitter can be thus inferred.

Impact ionization based devices, and other semiconductors operating in Geiger mode, are used in the prior art mostly for photodetection. There exist a variety of solid-state and non solid-state photon counters based on this principle. Circuits which are suited for detection or counting of photons are however not or not necessarily suited for detection of radiofrequency signals. Moreover, many known photodetectors require a Schottky diode for preventing a positive feedback. This Schottky diode, or other components, make most prior art Geiger mode operating semiconductors junction difficult if not impossible to integrate in a CMOS circuit.

In a preferred embodiment of the invention, the input signal charges are injected into the multiplication zone of the semiconductor element via a diode, thus preventing positive feedback without any Schottky diode.

The junction operates in Geiger mode, i.e. its reverse bias voltage is placed above breakdown. By doing so, the multiplication gain becomes virtually infinite, or at least very important, thus providing insensitivity from small variations in the reverse bias voltage. Through appropriate avalanche quenching techniques it is possible to ensure that the cycle can restart for the next detection after each detection event. Thus, with this circuit it is possible to detect single carriers as they are presented to the input.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 1:
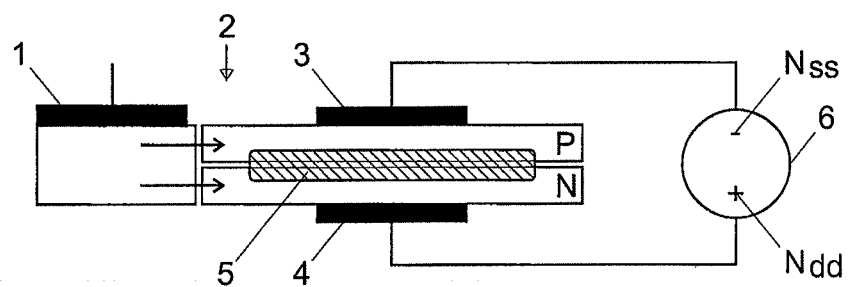
FIG. 1 shows the general structure of a single carrier avalanche diode (SCAD).

The general structure of a single carrier avalanche diode (SCAD) used in the circuit of the invention is illustrated on FIG. 1. In this device, the multiplication region 5 forms in the p-n junction 2 when biased near or above breakdown by a voltage source 6. Reference numbers 3 and 4 shows the anode and the cathode, respectively. When appropriately injected over an injector 1 in the multiplication region, minority carriers are accelerated and generate an avalanche by impact ionization. The avalanche will cause a large current to flow to the supply node. If the PN junction is biased below breakdown, the avalanche current will be limited and, in general, it will not cause damage. However, if the device is biased above breakdown, the avalanche current may destroy the device by electromigration in metals or overheating in the junction. To prevent this, means to quench the avalanche must be implemented. The quenched avalanche current is similar to a short pulse and can be easily detected and amplified. Thus single carriers can be detected and counted by means of simple and well-known digital counters.

Figure 2:
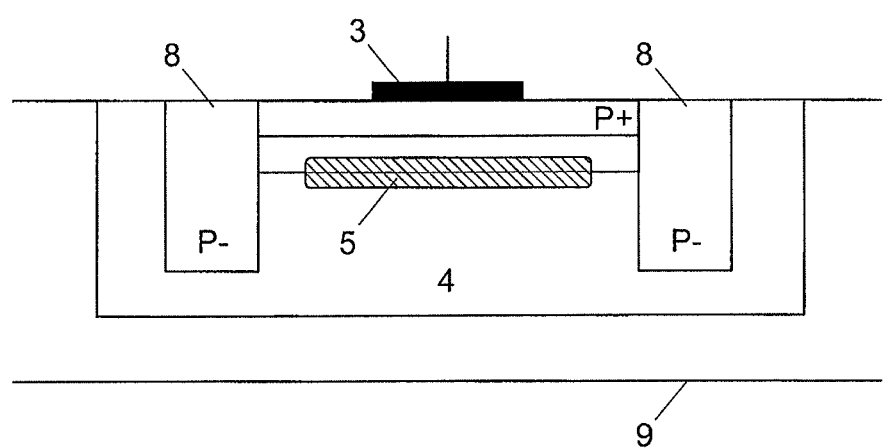
FIG. 2 shows a possible implementation of a SCAD in CMOS Technology.

In a preferred embodiment, the basic structure of a SCAD may be implemented as a p+-nwell junction, obtained, for example, in conventional CMOS processes as shown on FIG. 2.

The P+ implant acts as an anode 3 whereas the n well 4 corresponds to the cathode of FIG. 1. The semiconductor junction 3,4 thus acts as a diode. Early discharge is prevented by use of medium depth, lightly doped wells 8 that force the electric field at the edge of the p+ implant to gradually decrease instead of peaking, as would be the case in a conventional implant. This well is placed around the anode as a guard ring 8 to prevent early discharge throughout the perimeter of the junction. Reference number 9 shows the substrate p.

The anode 3 of the diode may be placed at zero potential or at a negative potential if compared to the potential at the n-well 4. When an avalanche occurs, electrons escape the multiplication region 5 and are collected by the n-well 4, while holes escape the implant p+ to be recalled onto the anode. If a resistive path 12 (FIG. 3) is placed between the cathode 4 and a positive supply voltage, the movement of charges from the cathode causes a current to flow through the resistive path and thus a voltage drop will be occur. When the drop is sufficiently large, the bias voltage across the junction reduces below breakdown, thus quenching the avalanche. This quenching scheme is known as "passive quenching". Alternative schemes, including "active quenching" circuits known in single photon detection circuits, can be used to perform quenching.

The resistive path 12 has also another purpose: that of translating the avalanche current into a voltage pulse. The voltage pulse preferably has amplitude of perhaps a few tens or hundreds of millivolts and it may be amplified using for example a comparator or an inverter 14. The latter may be integrated in CMOS if the appropriate combination of voltages is selected for the anode and the supply, i.e. Vop=−|Vbd|−Ve+VDD where VDD is the positive supply voltage.

After quenching, the diode must be brought back to Vop. This phase is called "recharge". During recharge, a sufficient number of charges must be placed onto the photodiode's cathode 4 to raise its voltage. This may be accomplished passively by means of the resistive path 12 ("passive recharge") or actively by means of a charge pump or current source to accelerate the process ("active recharge"). The circuit and method of the invention apply to devices independently on the recharge scheme.

The time required by quenching and recharge is known as "dead time". During the dead time no detection is possible, thus limiting the minimum detectable time separation between carriers and thus the detection rate and ultimately the bit rate.

Figure 3:
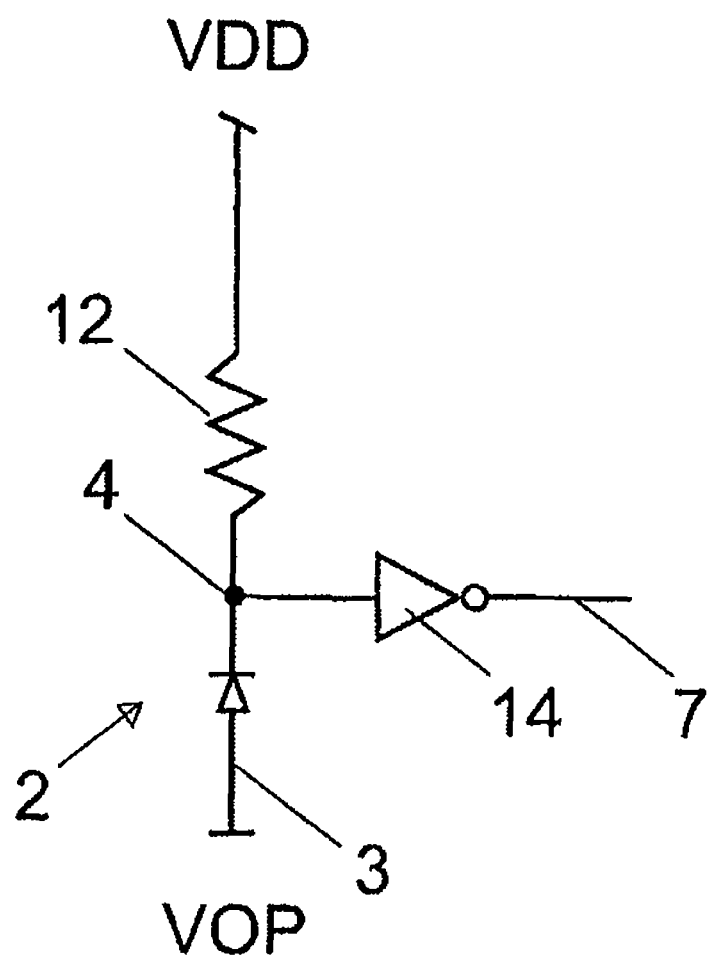
FIG. 3 illustrates a SCAD with a passive quenching and passive recharge circuit comprising a resistive path, and amplifier.

The resistive path 12 of FIG. 3 may be obtained through a grounded PMOS transistor or a biased NMOS or a linear poly-based resistor. However, the linearity of the quenching resistor is of no importance since the only required function of the device is the temporary lowering of the bias voltage below breakdown.

Figure 4:
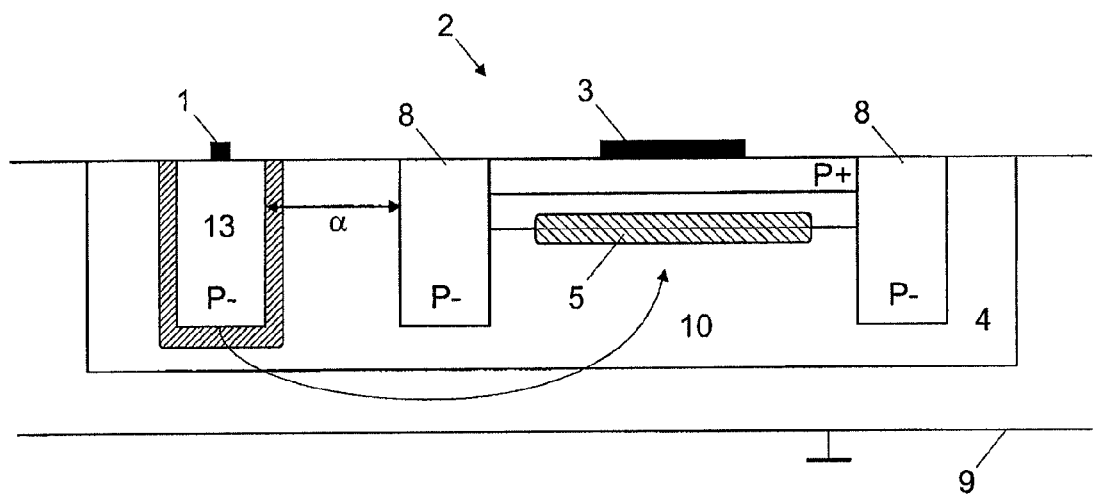
FIG. 4 shows a first embodiment of a SCAD where charges are injected through a junction outside the guard ring.

Several techniques may be used to inject input charges to the multiplication region. In one embodiment, charge injection may be achieved through a junction 13 formed outside the guard ring 8. This configuration is shown in FIG. 4. The arrow shows the path of the charges injected from the junction 13 into the injection region 10 near the multiplication zone 5.

In this embodiment, the voltage $V_{in}$ input at injector 1 must be forced to follow the potential of the nwell (the cathode), so as to prevent charges to flow back to the injector 1 when the junction becomes forward biased. This may be the case when the potential $V_T$ of the nwell falls below $V_{in}$, for example during the avalanche. To prevent this event, a positive feedback prevention and input decoupling circuit 16 such as the one shown in FIG. 5 may be used.

The transistor 20 ($T_q$) may be utilized to perform active recharge after an avalanche has been detected by an avalanche detection circuit (not shown) generating a control signal $V_c$. Alternatively, or in addition, $T_Q$ may be periodically turned on and then off, independently of the occurrence of an avalanche, by a clock circuit (not shown) putting an appropriate periodic voltage $V_c$ on the gate. The latter scheme is called "clocked recharge".

The function of the transistor 18 ($T_{FB}$) is to reset the injection junction 13 so as to prevent a potential build-up of charges that may force the junction to be forward biased. As before, the cathode (nwell) 4 is sensed through an amplifier 17, for example a simple inverter 14, that in turn will regenerate the signal and adapt its impedance. The input $V_{in}$ is applied to the injection junction 13 capacitively as shown in the figure.

Due to the distance that carriers have to cover from the injection junction 13 to the multiplication region 5, some carriers may recombine and thus never trigger the avalanche. As a result, the efficiency of the injection may be reduced. We define the Electron Detection Probability (EDP), the rate of pulses produced per electron on the input:

$$EDP = P_R P_A,$$

where $P_R$ is the probability of recombination and $P_A$ is the probability of a carrier triggers the avalanche. The time required by a carrier to trigger an avalanche is dominated by the transit time that, in turn, depends on the effective transit length and the mobility of the carrier. Drift is likely the dominant mechanism of carrier propagation until the boundary of the multiplication region 5 is reached, where the carriers may accelerate and/or tunnel into the junction. Electrons are preferred carriers due to higher mobility in the drift phase, however structures where holes are being injected in the multiplication region are also acceptable.

Due to the digital nature of the output signal it is possible to detect with very high timing resolution the arrival of a pulse $V_{in}$ of a few charges, for example a pulse from e.g. an antenna.

Such detection can be performed by means of a highly accurate time discriminator, such as a time-to-amplitude-converter (TAC) or a time-to-digital-converter (TDC) at the output 7.

A shield (not shown) at a voltage Vb1 may be used to avoid that external photons trigger an avalanche, Vb1 being chosen so as to prevent the shield to inject charges directly into the multiplication region. Alternatively, the shield can be used as a different (or additional) but less efficient injection point. The reason for this lack of efficiency is that the high thickness of the underlying insulation requires a higher voltage to generate a given number of carriers that can be injected in the multiplication region.

The distance α between the injection well 13 and the guard ring 8 must be selected carefully to avoid a short circuit between those two diffusions 13, 8 and to minimize the distance to the point of injection and thus to maximize $P_R$. The latter should be seriously accounted for since excessive recombination will result in reduced EDP.

Figure 6:
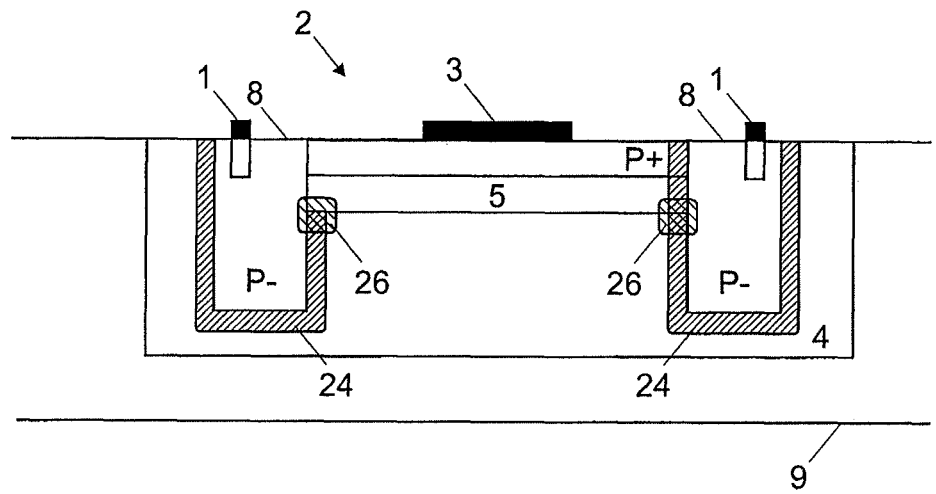
FIG. 6 shows a second embodiment of a SCAD where charges are injected in the guard ring.

The embodiment shown on FIG. 6 comprises a guard ring 8 which is utilized as injector. The advantage of this configuration is the reduced distance between the ring 8 and the injection point 26 near the multiplication zone 5. Thus, less recombination is possible and consequently a higher EDP is expected. The transit time and transit time spread are also expected to reduce. Reference number 24 shows a depletion region.

Figure 5:
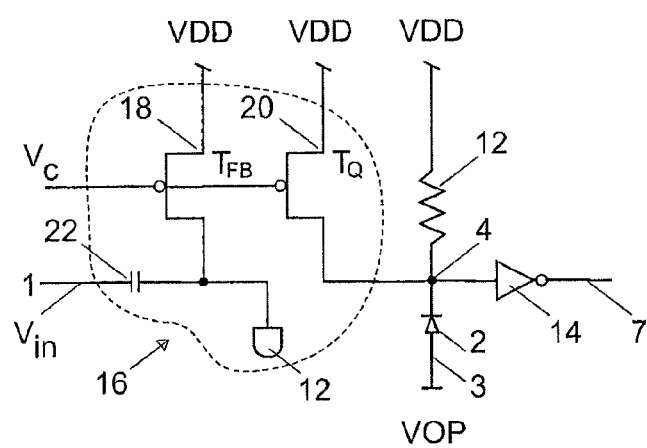
FIG. 5 shows a SCAD with a positive feedback prevention and input decoupling circuitry.
Figure 7:
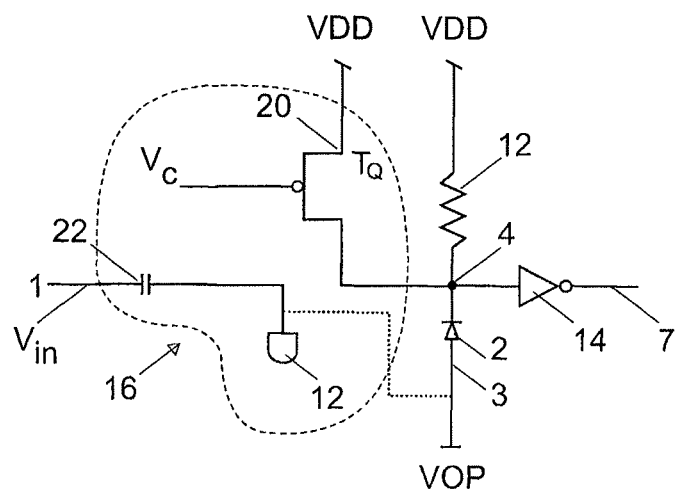
FIG. 7 shows a SCAD with an input decoupling circuitry.

The potential of the guard ring is in this case tight to the potential of the anode 3. Thus, also in this case a capacitive coupling 22 as shown in FIG. 7 should be used. The main difference with the positive feedback prevention and input decoupling circuit 16 of FIG. 5 is that a reset transistor $T_{FB}$ is not required, due to the low resistive path between the injection point 1 at $V_{in}$ (after decoupling) and Vop (equipotential zone shown with a dotted line on FIG. 7).

Another advantage of the positive feedback prevention and input decoupling circuit 16 of FIGS. 6-7 is the reduced size required by the cathode 4, thus reducing the parasitic capacitance across the p-n junction and thus reducing the overall dead time. Again, also in this configuration, the metal shield (not shown) above or around the device can be used to inject carriers into the multiplication region by capacitive coupling. In addition, it can be envisioned to place the device at the focal center of an antenna to efficiently capture EM power as it is received by the antenna.

Figure 8:
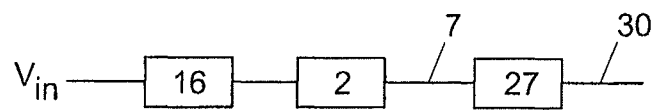
FIG. 8 is a block diagram of the complete circuit of the invention.

FIG. 8 illustrates how the semiconductor element 2 of any of the above described embodiments may be used with the corresponding circuit 16 for amplifying an input radiofrequency signal, for example a signal delivered by an antenna, and for converting it into a digital signal 7. The junction 2 and the amplifying element may be CMOS implemented in and integrated on an integrated circuit with a digital part 27 for performing tasks such as demodulating, mixing, filtering, tdc, FFT conversion and so on.

REFERENCE NUMBERS

1 Injector
2 Semiconductor junction or element
3 Anode (at ground or negative voltage)
4 Cathode (n-well)
5 Multiplication zone
6 Power source
7 Digital output signal
8 Guard ring
9 P-sub
12 Resistive path
13 Injection junction
14 Amplifier (for example inverter or comparator)
16 Positive feedback prevention and decoupling circuitry
18 Reset switch for the injection junction
20 Active recharge switch
22 Input capacitor
24 Depletion region
26 Injection zone
27 Digital part
Vop Positive supply voltage

The invention claimed is:

1. An integrated receiving circuit for radio frequency and high speed signals, comprising:
   an amplifying element using the multiplication zone of a reverse biased semiconductor junction operating in Geiger mode for amplifying an input radio frequency signal and converting said input radio frequency signal into a digital signal, wherein the amplifying element comprises an injector which can receive an input radio frequency signal and can convert the received input radio frequency signal into input charge carriers which are injected into the multiplication zone of the reverse biased semiconductor junction operating in Geiger mode; and
   a digital circuitry for digitally processing said digital signal.

2. The integrated receiving circuit of claim 1, further comprising a recharge circuit for recharging said multiplication zone after an avalanche.

3. The integrated circuit of claim 2, further comprising a clock circuit periodically turning on a switch for recharging said multiplication zone.

4. The integrated circuit of claim 2, comprising an avalanche detection circuit for commanding a switch to recharge said multiplication zone when an avalanche has been detected.

5. The integrated circuit of claim 1, further comprising an active or passive quenching circuit for quenching the signal delivered by said semiconductor junction.

6. The integrated circuit of claim 1, further comprising a guard ring around said multiplication zone.

7. The integrated circuit of claim 6, comprising a circuit for injecting charges into said guard ring to trigger avalanches in said multiplication zone.

8. The integrated circuit of claim 6, comprising an injection junction outside said guard ring for injecting charges during the recharge of said multiplication zone.

9. The integrated circuit of claim 1, comprising a shield for preventing photons to trigger an avalanche, wherein charges are injected directly into said shield.

10. The integrated circuit of claim 1, comprising an antenna, said multiplication zone being close to the focal centre of said antenna to capture electromagnetic power received by the antenna for triggering an avalanche.

11. The integrated circuit of claim 1, said digital circuitry comprising at least one of a digital mixing and demodulating circuit for either mixing or demodulating said digital signal.

12. The integrated circuit of claim 1, wherein said amplifying element and said digital part are both CMOS integrated.

13. A method for processing a radio frequency signal, comprising the steps of:
    receiving an input radio frequency signal;
    converting the received input radio frequency signal into input charge carriers;
    injecting said input charge carriers into the multiplication zone of the reverse biased semiconductor junction operating in Geiger mode, to form an avalanche in a reverse biased semiconductor junction operating in Geiger mode and to output a digital signal, and
digital processing said digital signal.

* * * * *